United States Patent [19]

Nelson et al.

[11] Patent Number: 5,656,965
[45] Date of Patent: Aug. 12, 1997

[54] TURN-OFF CIRCUITRY FOR A HIGH-SPEED SWITCHING REGULATOR DRIVE CIRCUIT

[75] Inventors: Carl T. Nelson, San Jose; Robert Essaff, Fremont, both of Calif.

[73] Assignee: Linear Technology Corporation, Milpitas, Calif.

[21] Appl. No.: 488,042

[22] Filed: Jun. 7, 1995

Related U.S. Application Data

[63] Continuation of Ser. No. 228,478, Apr. 15, 1994.

[51] Int. Cl.$^6$ .................................................. H03K 17/00
[52] U.S. Cl. .................................. 327/365; 327/377
[58] Field of Search .................. 326/82–87, 89–91; 327/108–112, 198, 365, 374, 376, 377, 482, 484, 490

[56] References Cited

U.S. PATENT DOCUMENTS

| | | | |
|---|---|---|---|
| 4,331,886 | 5/1982 | Perner et al. | 327/110 |
| 4,331,887 | 5/1982 | Jadus et al. | 327/110 |
| 4,677,324 | 6/1987 | Ronan, Jr. et al. | 327/377 |
| 4,755,741 | 7/1988 | Nelson | 323/289 |
| 4,823,070 | 4/1989 | Nelson | 323/285 |
| 5,218,243 | 6/1993 | Keown et al. | 307/446 |

OTHER PUBLICATIONS

"LT1070/LT1071: 5A and 2.5A High Efficiency Switching Regulators," *Linear Technology Data Sheet*, Linear Technology Corporation, Milpitas, California, Apr. 1989, pp. 1–12.

"LT1074/LT1076: Step–Down Switching Regulator," *Linear Technology Data Sheet*, Linear Technology Corporation, Milpitas, California, Jun. 1991, pp. 1–16.

"LT1070 Design Manual," *Linear Technology Application Note 19*, by C. Nelson, Linear Technology Corporation, Milpitas, California, Jun. 1986, pp. 1–76.

"LT1074/LT1076 Design Manual," *Linear Technology Application Note 44*, by C. Nelson, Linear Technology Corporation, Milpitas, California, Sep. 1991, pp. 1–48.

*Primary Examiner*—Timothy P. Callahan
*Assistant Examiner*—Jeffrey Zweizig
*Attorney, Agent, or Firm*—Fish & Neave; Robert W. Morris; Garry J. Tuma

[57] ABSTRACT

Circuits and methods are provide for improving the turn-off switching speed of a high-speed integrated circuit, bipolar switching regulator. The regulator runs at megahertz frequencies, yet is efficient as previously available bipolar integrated circuit switching regulators operating at much lower frequencies. The turn-off circuitry increases the speed at which the switch turns off by momentarily providing additional current to boost the base discharge current during the on-to-off transition period of the switch. In a preferred embodiment, the circuitry includes a capacitor for storing a charge, a resistor for limiting the amount of additional current provided, and a diode for delivering the additional current to the base of an NPN transistor, the collector of which is coupled to the switch's base, for boosting that transistors collector current and the switch's base discharge current. The diode then blocks current during the off-to-on transition period of the switch. Thus, the turn-off circuitry operates on an AC basis and only when the switch is turning off.

6 Claims, 3 Drawing Sheets

5,656,965

TURN-OFF CIRCUITRY FOR A HIGH-SPEED SWITCHING REGULATOR DRIVE CIRCUIT

CROSS-REFERENCE TO RELATED APPLICATION

This application is a continuation of U.S. patent application Ser. No. 08/228,478, filed Apr. 15, 1994.

The present invention relates to a high-speed switching regulator. More particularly, the invention relates to circuits and methods for improving the turn-off switching speed of a high-speed, bipolar integrated circuit switching regulator that can switch at megahertz frequencies, yet operates at efficiencies comparable to or better than previously available bipolar switching regulators operating at much slower speeds.

BACKGROUND OF THE INVENTION

With battery powered portable computers on the rise, the demand for efficient DC-to-DC power conversion is increasing. Battery life is of paramount importance to portable systems. Other important considerations are reducing space, weight and cost.

Switching regulators have long been known as offering a means for converting battery voltage in portable systems to other voltages at high efficiencies. However, a problem with previously available bipolar integrated circuit regulators has been that the switch operates at relatively low frequencies (e.g., in the neighborhood of 100 kHz). These low frequencies, while enabling the circuitry to operate with reasonable efficiency, require the use of relatively large external inductors and other components to form the switching regulator. Previously available high-speed, bipolar switching regulators that use smaller external components have suffered from a problem of inefficiency, and thus consume too much battery power.

In view of the foregoing, it would be desirable to provide an improved integrated circuit, bipolar switching regulator that operates at high-frequencies, in order to reduce the space, weight and cost of external inductors and other components used with the regulator.

It would further be desirable to provide circuits and methods for improving the turn-off switching speed of such an integrated circuit switching regulator that operates at high efficiency, in order to prolong battery life in portable systems.

SUMMARY OF THE INVENTION

In view of the foregoing, it is an object of the present invention to provide an improved integrated circuit, bipolar switching regulator that operates at high-frequencies, in order to reduce the space, weight and cost of external inductors and other components used with the regulator.

It is a further object of the present invention to provide circuits and methods for improving the turn-off switching speed of such an integrated circuit switching regulator that operates at high efficiency, in order to prolong battery life in portable systems.

These, and other objects of the present invention, are accomplished by an improved integrated circuit, bipolar switching regulator circuit. The circuit can operate in the megahertz range, yet at efficiencies comparable to or better than switching regulators heretofore available that operated at much lower frequencies. Turn-off circuitry momentarily boosts the base discharge current of the switch while the switch is transitioning from on to off, in order to increase the speed at which the switch turns off in an efficient, power-conserving manner.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
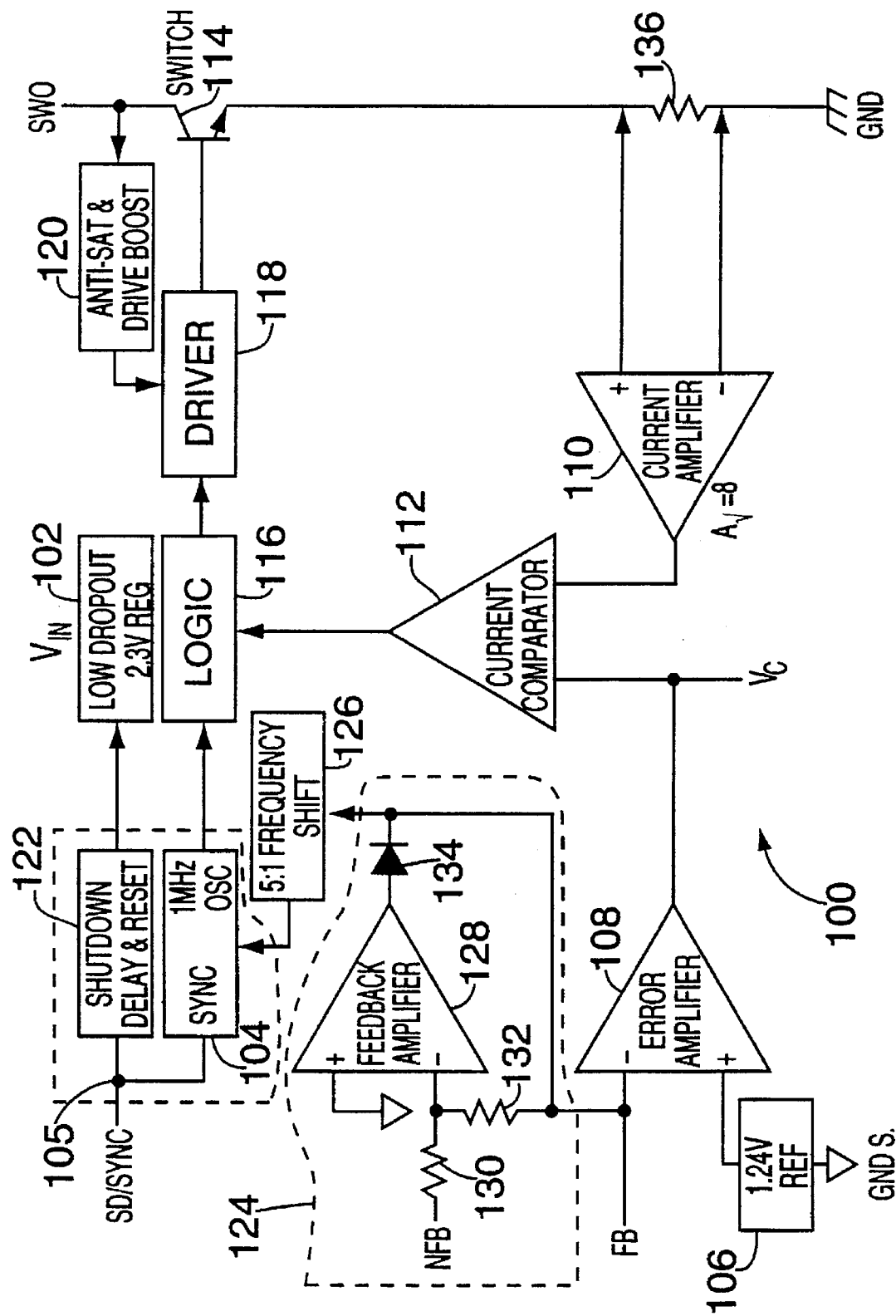
FIG. 1 is a schematic block diagram of a current mode switching regulator incorporating principles of the present invention.

FIG. 1 shows a schematic block diagram of a current mode switching regulator which incorporates the principles of the present invention. Although the principles of the invention are described with respect to a current mode regulator, it will be apparent to persons skilled in the art that many of the principles described below are equally applicable to other regulator circuits.

Switching regulator 100 may include a low dropout regulator 102, a trimmed oscillator 104, a trimmed reference voltage 106, an error amplifier 108, a current amplifier 110, a current comparator 112 to drive a switch 114. As is described below, in accordance with the principles of the present invention, regulator 100 also may include logic circuitry 116 and driver circuitry 118 to drive switch 114, as well as drive boost circuitry 120. Additionally, regulator 100 may include combined shutdown and synchronization circuitry 122, which utilizes a single input pin, a negative feedback regulation network 124 and an oscillator frequency shifting network 126. Negative feedback network 124 may include a feedback amplifier 128, resistor 130 and 132, and a means of blocking the output of the amplifier when its output goes low, shown in FIG. 1 as a simple diode 134. Current amplifier 110 measures the current passing through switch 114 by using a low value resistor 136 (e.g., 0.1 ohms). The function of nodes $V_C$, SWO and $V_{IN}$ will also be apparent from the detailed discussion below.

Figure 2:
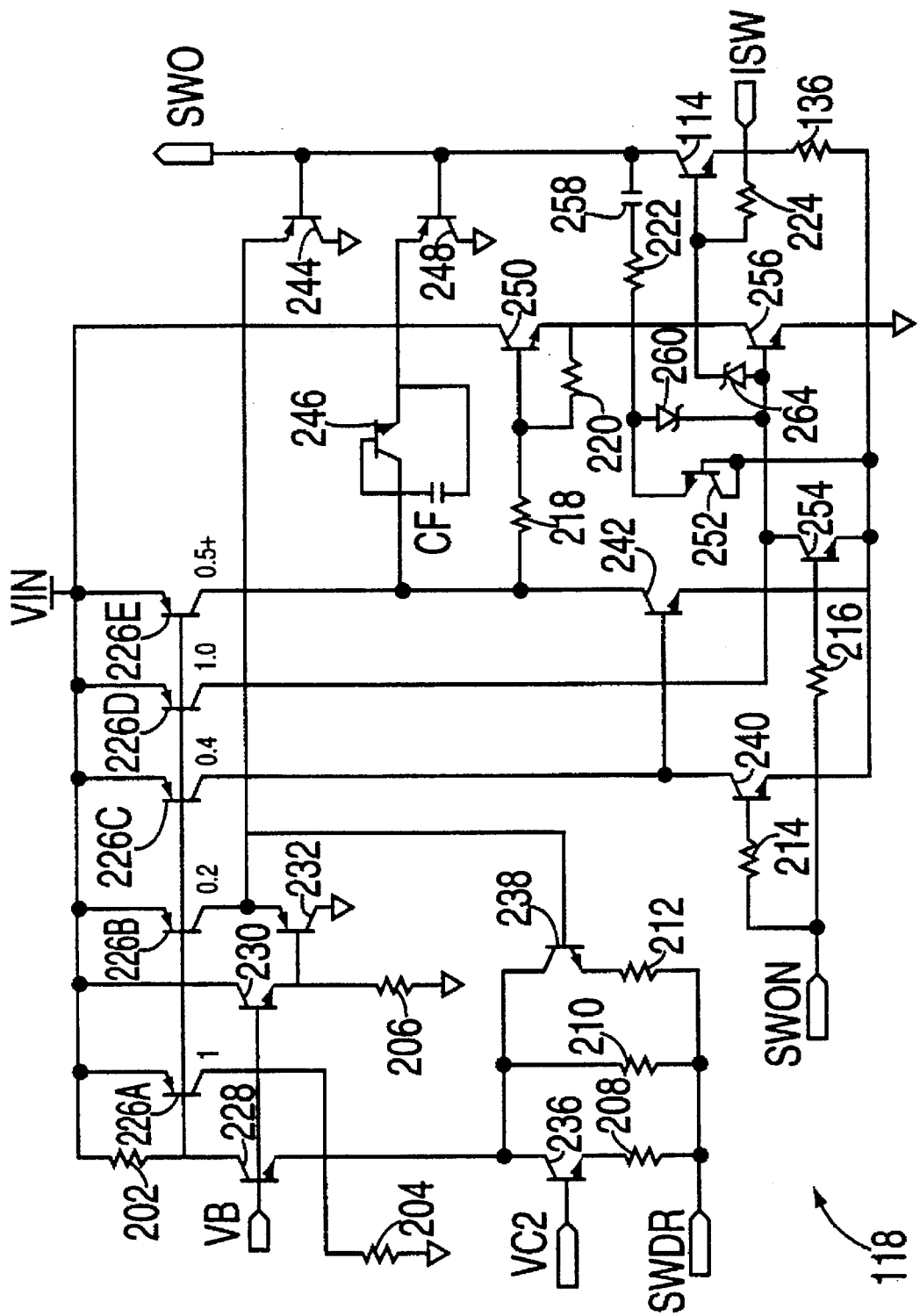
FIG. 2 is a schematic diagram of an exemplary embodiment of an integrated circuit switching regulator incorporating principles of the present invention.

FIG. 2 shows a detailed schematic diagram of an exemplary embodiment of the driver portion of an integrated circuit switching regulator incorporating principles of the present invention. The circuit is designed for coupling to a source of DC input voltage applied across terminals $V_{IN}$ and GND.

In the circuit of FIG. 2, the switch is comprised of power NPN transistor 114. Drive current for the switch is provided by PNP transistor 226E in combination with transistor 250. Terminal SWO is the switch output terminal for connection to an external load (not shown) that, in turn, is coupled to a source of electrical potential. This external load typically would include one or more current-steering diodes, an inductive element, and other components arranged in conventional fashion (e.g., in buck, flyback or boost configurations) to implement a complete switching regulator. Terminal ISW is a node where measurements of the current passing through switch 114 may be made (by using resistor 136). For example, when the circuit shown in FIG. 2 is used in a current mode switching regulator, the voltage across resistor 136 is used to determine when to shut off switch 114. The measured voltage is compared to a reference voltage which is set to represent the current shut-off point. When the measured voltage exceeds the reference voltage, the current trip point has been reached and switch 114 is shut-off (when the circuit has been shut down or a high impedance condition exists, resistor 224 prevents excess leakage current from inadvertently turning on switch 114).

Switch 114 is turned on and off by a signal, SWON ("SWitch ON"), via NPN transistors 240, 242, 254 and 256. When SWON is de-asserted (i.e., it is low), transistors 240 and 254 are off. This allows current provided by the collectors of PNP transistors 226C and 226D to drive the bases of transistors 242 and 256, turning those transistors on. (As further discussed below, transistors 226A–E form a controllable current source. Although shown as five separate transistors, persons skilled in the art will recognize that transistors 226A–E may be implemented instead, as in an actual embodiment of the circuit, as a single transistor 226 having multiple collectors A–E. In either case, transistor 226 is kept off during shutdown or high impedance conditions by resistor 202 which is connected to its base.) When transistor 242 is on, the base of transistor 250 is pulled low to turn that transistor off (transistor 250 is kept off by resistor 220). This prevents base drive from reaching transistor 114, and so the switch is off. As further discussed below, transistor 256 helps to turn and maintain switch 114 off (and diode 264 is used to increase the turn off speed of transistor 256).

When signal SWON is asserted high, the opposite occurs. Transistors 240 and 254 are turned on, causing the currents provided by the collectors of transistors 226C and 226D to be shunted to ground. The bases of transistors 240 and 254 are connected to ballast resistors 214 and 216, respectively, to prevent one saturated transistor from driving the other into saturation. Transistors 242 and 256, accordingly, are turned off. As a result, collector current from transistor 226E drives the base of transistor 250 through resistor 218 to turn that transistor on. Transistor 250 and PNP transistor 226E thus drive the base of switch 114 to turn the switch on.

The amount of current required from transistor 226E depends on whether switch 114 is conducting a large or small current. When the load on switch 114 is high, transistor 226E should preferably supply a relatively large current sufficient to cause the switch to turn on and to be driven to a desired operating point. The precise amount of drive current required to accomplish this will vary depending on the load on switch 114. Too much drive current is a waste of power and reduces efficiency. Too little drive current prevents the switch from turning on completely and would leave the switch in an undesirable high power dissipation state. When switch 114 is off, on the other hand, transistor 226E preferably should provide only a nominal or zero current.

The circuit of FIG. 2 thus includes circuitry for reducing switch drive current during periods of time that switch 114 is off. This circuitry includes transistors 236, 238 and 228 as well as resistors 208, 210, 212 and 204, operating in conjunction with signal SWDR. The circuitry operates as follows.

When switch 114 is off (i.e., when signal SWON is low), signal SWDR ("SWitch DRive") is high. Thus, no current flows through transistor 236, resistor 210 or transistor 238.

To keep the PNP current source circuitry of transistors 226A–E biased, resistor 204 provides a path for a nominal current to flow through current-setting transistor 226A. NPN transistor 228, driven by reference voltage $V_B$ (which, in the exemplary circuit of FIG. 2, is preferably 2.2 volts), drives the base of transistor 226A until transistor 226A's collector current is sufficient to support the load (resistor 204) on transistor 226A's collector. Reference voltage $V_B$ may be generated by circuitry, not shown, in any of a number of conventional ways that will be readily apparent to those skilled in the art. For example, a bandgap reference circuit may be connected to an amplifier to adjust the bandgap reference voltage $V_{BG}$ (typically 1.24 volts) to the desired reference voltage (e.g., 2.2 volts). The voltage at the collector of transistor 226A thus is equal to the magnitude of $V_B$ (2.2 volts) minus the base-emitter voltage of transistor 228 (about 0.7 volts). The setting by resistor 204 of transistor 226A's nominal current sets the nominal currents provided by transistors 226B–E. This is because the collector currents of transistors 226B–E are related to the collector current of transistor 226A by the ratios of the areas of the transistors. As indicated in the exemplary circuit of FIG. 2, the ratios of the currents A:B:C:D:E of transistors 226A–E are 1:0.2x:0.4:1.6x:5x, respectively.

An aspect of the present invention, for efficiently increasing the speed of operation of switch 114, is a circuit that decreases switch turn off time. In FIG. 2, this circuit includes a network comprising capacitor 258, resistor 222, diode-connected transistor 252, and diode 260. The circuit works as follows.

The speed with which transistor 114 turns off is related to its base discharge current. Generally, as the base discharge current of a transistor increases the speed at which the transistor turns off increases. The circuit including capacitor 258, resistor 222 and diode 260 takes advantage of this principle by momentarily boosting switch 114-s base discharge current while the switch is transitioning from on to off, in order to increase the speed with which that transition occurs. Once the transistor has turned off, the boosting ceases. This is shown in FIGS. 3A and 3B, which plots against time the voltages on the collectors of transistors 254, 256 and 114 in relation to the base ($I_B$) and collector ($I_C$) currents of transistor 256 and the current through capacitor 258.

Figure 3A:
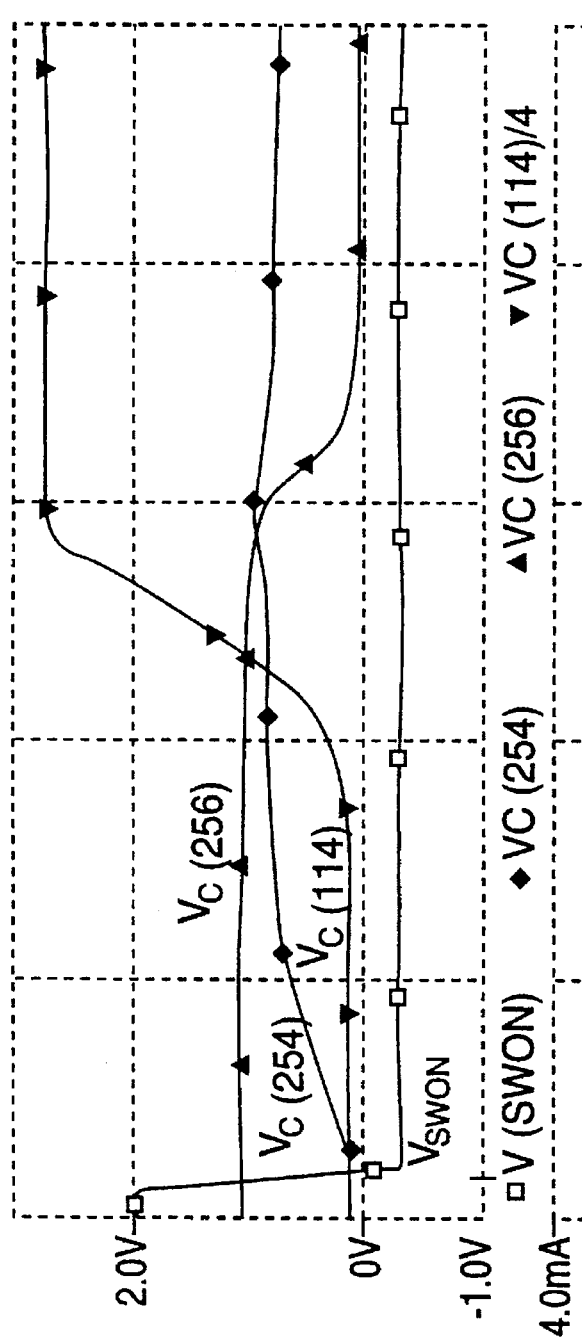
FIG. 3A is a graph showing the voltages on the collectors of transistors 254, 256 and 114 of FIG. 2 against time.
Figure 3B:
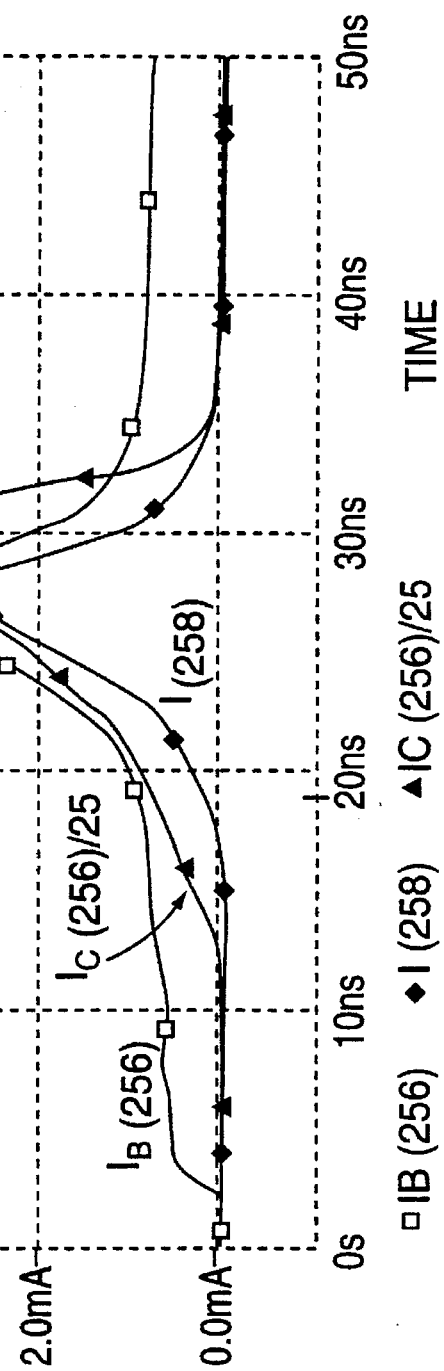
FIG. 3B is a graph showing currents through the base and collector of transistor 256 and capacitor 258 of FIG. 2 against time.

In FIG. 3A, the process of turning switch 114 off commences when signal SWON transitions from high to low. When this happens, as the figure shows, transistor 254 will turn off and transistor 256 will turn on to provide a base discharge current for switch 114. The current that transistor 256's collector can remove from transistor 114's base is limited, however, by the amount of current that transistor 226D delivers to transistor 256's base. Capacitor 258, resistor 222 and diode 260 operate to augment this base current when switch 114's collector voltage begins to rise (which occurs when the switch begins its transition from on to off, as shown by the trace labelled $V_{C114}$ in FIG. 3A). This additional current through capacitor 258 (see FIG. 3B, trace $I_{258}$) increases transistor 256's collector current (FIG.3B, trace $I_{C356125}$), to increase the base discharge current of switch 114. As transistor 114's collector continues rising, capacitor 258, resistor 222 and diode 260 continue to boost transistor 256's collector current. The result is that the time it takes switch 114 to turn off is reduced.

The boosted discharge current, fed through capacitor 258, is only required on an AC basis. It is also required only when switch 114 is being turned off (i.e., when switch 114's collector voltage is rising). Diode 260 is used, accordingly, to block current when switch 114 is being turned on. Resistor 222 limits the amount of the current boost. Diode-connected transistor 252, shown coupled between ground and the anode of diode 260, is provided to discharge capacitor 258 on each ON cycle of switch 114 to prevent the capacitor from peak detecting the collector voltage of the switch.

By boosting transistor 114's base discharge current only when required (i.e., while switch 114 is transitioning from on to off), the circuit of the present invention further increases switching speed without unnecessarily wasting power. Persons skilled in the art will recognize that the discharge current for transistor 114 could have been increased by increasing transistor 226D's collector current. However, permanently increasing this current wastes power because the boosted current is only needed for a short time.

The circuits of FIGS. 1 and 2 can be implemented using commercially available components. For example, the circuits can be constructed and operated using the components and values set forth in Table 1, below (for the transistors, only transistor type and area ratio are given):

TABLE 1

| Capacitor C_F: | 15 picofarads |
| --- | --- |
| Capacitor 526: | 22 picofarads |
| Resistor 130: | 100K ohms |
| Resistor 132: | 50K ohms |
| Resistor 136: | 0.1 ohms |
| Resistor 202: | 25K ohms |
| Resistor 204: | 15K ohms |
| Resistor 206: | 30K ohms |
| Resistor 208: | 1.5K ohms |
| Resistors 210: | 5K ohms |
| Resistors 212, 216, 222 and 224: | 1K ohms |
| Resistor 214: | 4K ohms |
| Resistor 218: | 10 ohms |
| Resistor 220: | 10K ohms |
| Transistor 114: | NPN; 6000:1 |
| Transistors 226A, 232, and 244 | PNP; 1:1 |
| Transistor 226B: | PNP; 0.2:1 |
| Transistor 226C: | PNP; 0.4:1 |
| Transistor 226D: | PNP; 1.6:1 |
| Transistor 226E: | PNP; 5:1 |
| Transistors 228 and 240 | NPN; 2:1 |
| Transistor 230: | NPN; 1:1 |
| Transistors 236, 238 and 252 | NPN; 5:1 |
| Transistors 242 and 254: | NPN; 10:1 |
| Transistor 246: | NPN; 30:1 |
| Transistor 248: | PNP; 20:1 |
| Transistor 250: | NPN; 180:1 |
| Transistor 256: | NPN; 120:1 |

While preferred embodiments of the invention have been set forth for purposes of the disclosure, modification of these embodiments may occur to those skilled in the art. For example, while the circuits of the present invention have been disclosed in the context of a control circuit for a switching regulator, it will of course be understood by those skilled in the art that the invention may be employed in any type of circuit utilizing switching transistors. Persons skilled in the art will appreciate that the present invention can be practiced by other than the described embodiments, which are presented for purposes of illustration and not of limitation, and that the present invention is limited only by the claims which follow.

What is claimed is:

1. A circuit for driving a transistor switch adapted to be coupled to a load, the switch having a duty cycle defined by period of time that the switch is on followed by a period of time that the switch is off, the drive circuit comprising:

a first transistor for generating a drive current at magnitude sufficient to cause the switch to turn on;

a second transistor for coupling the drive current to the switch to cause the switch to be turned on;

third and fourth transistors for generating a discharge current to cause the switch to turn off;

a boost circuit for boosting the generated discharge current to decrease the time required to turn off the switch, the boost circuit comprising:

a capacitor coupled to the switch;

an impedance having first and second ends, the first end being coupled to the capacitor;

a first diode coupled to the second end and to the switch, the first diode being coupled to conduct current to the switch; and a second diode coupled to the second end and to a source of electrical potential, the second diode being coupled to conduct current from the source of electrical potential, such that the current from the source of electrical potential boosts the discharge current provided to turn off the switch; and a third diode coupled between the base and collector of the fourth transistor to conduct current to the collector.

2. The circuit defined in claim 1 wherein the third diode is a Schottky diode.

3. A circuit for driving a transistor switch adapted to be coupled to a load, the switch having a duty cycle defined by a period of time that the switch is on followed by a period of time that the switch is off, the drive circuit comprising:

a PNP bipolar transistor coupled to a second electric potential for generating a drive current at a magnitude sufficient to cause the switch to turn on;

a second transistor for coupling the drive current to the switch to cause the switch to be turned on;

third and fourth transistors for generating a discharge current to cause the switch to turn off, wherein the third transistor is a PNP bipolar transistor coupled to a third electric potential; and a boost circuit for momentarily providing additional current to boost the generated discharge current to decrease the time required to turn off the switch.

4. The circuit defined in claim 3 wherein the second electric potential and the third electric potential are the same supply.

5. A circuit for driving a transistor switch adapted to be coupled to a load, the switch having a duty cycle defined by a period of time that the switch is on followed by a period of time that the switch is off, the drive circuit comprising:

a first transistor for generating a drive current at magnitude sufficient to cause the switch to turn on;

a second transistor for coupling the drive current to the switch to cause the switch to be turned on;

third and fourth transistors for generating a discharge current to cause the switch to turn off, wherein the first transistor and the third transistor form a controllable current source; and a boost circuit for momentarily providing additional current to boost the generated discharge current to decrease the time required to turn off the switch.

6. A circuit for driving a transistor switch adapted to be coupled to a load, the switch having a duty cycle defined by a period of time that the switch is on followed by a period of time that the switch is off, the drive circuit comprising:

a first transistor for generating a drive current at a magnitude sufficient to cause the switch to turn on;

a second transistor for coupling the drive current to the switch to cause the switch to be turned on;

third and fourth transistors for generating a discharge current to cause the switch to turn off; and a boost circuit for momentarily providing additional current to boost the generated discharge current to decrease the time required to turn off the switch, wherein the boost circuit comprises:
  a capacitor coupled to the switch,
  an impedance having first and second ends, the first end being coupled to the capacitor,
  a first diode coupled to the second end and to the fourth transistor, the first diode being coupled to conduct current to the fourth transistor, and
  a second diode coupled to the second end and to a source of electrical potential for discharging the capacitor during the period of time when the switch is on, wherein the source of electric potential is ground.

* * * * *